United States Patent
Takada

(10) Patent No.: US 10,078,343 B2
(45) Date of Patent: Sep. 18, 2018

(54) OUTPUT CIRCUIT

(71) Applicant: SII Semiconductor Corporation, Chiba-shi, Chiba (JP)

(72) Inventor: Kosuke Takada, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/449,320

(22) Filed: Mar. 3, 2017

(65) Prior Publication Data
US 2017/0255219 A1 Sep. 7, 2017

(30) Foreign Application Priority Data

Mar. 7, 2016 (JP) .................................. 2016-043655

(51) Int. Cl.
| | | |
|---|---|---|
| G05F 1/00 | (2006.01) | |
| H03K 3/00 | (2006.01) | |
| G05F 1/595 | (2006.01) | |
| H03B 1/00 | (2006.01) | |
| G11C 5/14 | (2006.01) | |
| G05F 1/10 | (2006.01) | |
| G05F 3/16 | (2006.01) | |
| H03K 17/041 | (2006.01) | |
| H03K 17/0812 | (2006.01) | |

(52) U.S. Cl.
CPC .......... *G05F 3/16* (2013.01); *H03K 17/04106* (2013.01); *H03K 17/08122* (2013.01)

(58) Field of Classification Search
CPC ............... G05F 3/16; H03K 17/04106; H03K 17/08122
USPC ............................ 327/530–546; 323/312–317
See application file for complete search history.

(56) References Cited

U.S. PATENT DOCUMENTS

| | | | |
|---|---|---|---|
| 6,346,829 B1* | 2/2002 | Coddington ....... | H03K 19/0027 326/68 |
| 6,683,486 B2* | 1/2004 | Hanson .................. | H03K 3/012 327/333 |
| 7,053,696 B2* | 5/2006 | Shiratake ............... | G05F 1/565 257/E29.326 |
| 7,746,126 B2* | 6/2010 | Koji ..................... | G09G 3/3688 327/108 |
| 2010/0045369 A1* | 2/2010 | Han ....................... | G05F 3/245 327/543 |

(Continued)

FOREIGN PATENT DOCUMENTS

JP 08-139588 A 5/1996

*Primary Examiner* — Brandon S Cole
(74) *Attorney, Agent, or Firm* — Brinks Gilson & Lione

(57) ABSTRACT

The output circuit includes: a control voltage generating circuit configured to generate a control voltage; a first MOS transistor having a gate for receiving the control voltage; a second MOS transistor having a gate to which a first input signal is input; a third MOS transistor having a gate to which a second input signal is input; and a fourth MOS transistor which has a gate connected to a source of the first MOS transistor, and a drain connected to an output terminal, and is configured to be driven with the first input signal and the second input signal to output an output signal to the output terminal. The control voltage generating circuit is configured to absorb fluctuations in control voltage, which are caused due to changes in first input signal and second input signal, to thereby maintain the control voltage at a predetermined voltage.

4 Claims, 7 Drawing Sheets

(56) References Cited

U.S. PATENT DOCUMENTS

2012/0206123 A1* 8/2012 Mulligan ............... H02M 3/155
                                                        323/313
2015/0261235 A1* 9/2015 Ng ........................ G05F 1/595
                                                        323/270

* cited by examiner

OUTPUT CIRCUIT

RELATED APPLICATIONS

This application claims priority under 35 U.S.C. § 119 to Japanese Patent Application No. 2016-043655 filed on Mar. 7, 2016, the entire content of which is hereby incorporated by reference.

BACKGROUND OF THE INVENTION

1. Field of the Invention

The present invention relates to an output circuit, and more particularly, to an output circuit configured to perform control of turning on/off a MOS transistor connected to high voltage using a low voltage signal, to thereby generate an output signal.

2. Description of the Related Art

Output circuits that generate an output signal for driving a load operating under a high voltage of several tens of volts are, for example, configured to turn on/off a MOS transistor connected to high voltage using a low voltage signal, to thereby obtain an output signal at high voltage from the MOS transistor.

As an example of such output circuits, a related-art output circuit 600 is illustrated in a circuit diagram of FIG. 6.

The related-art output circuit 600 includes a power supply terminal 601, a ground terminal 602, an input terminal 615, an NMOS transistor 616, resistors 611 and 613, a Zener diode 610, a PMOS transistor 612, and an output terminal 614.

The PMOS transistor 612 has a source connected to the power supply terminal 601, and a drain connected to the output terminal 614. The resistor 611 has one end connected to the power supply terminal 601. The Zener diode 610 has a cathode connected to the power supply terminal 601, and an anode connected to the other end of the resistor 611 and a gate of the PMOS transistor 612. The resistor 613 has one end connected to the anode of the Zener diode 610. The NMOS transistor 616 has a gate connected to the input terminal 615, a source connected to the ground terminal 602, and a drain connected to the other end of the resistor 613.

The related-art output circuit 600 is configured to perform operation of turning on/off the NMOS transistor 616 with an input signal IN at low voltage input to the input terminal 615, thereby driving the PMOS transistor 612 to output an output signal to the output terminal 614.

As a first state, a case in which the NMOS transistor 616 is turned on is assumed. Current is caused to flow through the Zener diode 610, the resistor 613, and the resistor 611, and a gate voltage VGATE of the PMOS transistor 612 is clamped by a breakdown voltage Vz of the Zener diode 610. That is, the gate voltage VGATE of the PMOS transistor 612 is a voltage obtained by subtracting the breakdown voltage Vz of the Zener diode 610 from a voltage VDD at the power supply terminal 601, which is a high voltage. Thus, the PMOS transistor 612 can be turned on with a gate-source voltage being prevented from exceeding a withstand voltage of the PMOS transistor 612. The resistor 613 is a resistor necessary for restricting current that flows through the Zener diode 610.

As a second state, a case in which the NMOS transistor 616 is turned off is assumed. The gate voltage VGATE of the PMOS transistor 612 is pulled up to the voltage VDD of the power supply terminal 601 by the resistor 611, and the PMOS transistor 612 is thus turned off.

As described above, according to the related-art output circuit 600, the PMOS transistor 612 can be switched based on a signal input to the input terminal 615 while the gate-source voltage of the PMOS transistor 612 is prevented from exceeding the withstand voltage of the PMOS transistor 612, and output can be obtained from the output terminal 614 (for example, see Japanese Patent Application Laid-open No. Hei 8-139588).

However, the related-art output circuit 600 as described above has a problem in that it is difficult to perform switching operation of the PMOS transistor 612 at high speed.

The reason is that, in turning on/off the PMOS transistor 612, a gate-source capacity of the PMOS transistor 612 is charged through the resistor 613 and is discharged through the resistor 611, and hence charging and discharging take a long time.

In FIG. 7, the wavelengths of the input signal IN and the gate voltage VGATE of the PMOS transistor 612 of the related-art output circuit 600 are shown. The maximum value of the input signal IN is 5 V and the minimum value thereof is 0 V. When the input signal IN rises at time t0, the gate-source capacity of the PMOS transistor 612 is charged through the resistor 613. As shown in FIG. 7, the voltage VGATE decreases and is clamped by the breakdown voltage Vz of the Zener diode 610 to be stabilized at VDD-Vz finally. The voltage VGATE takes a long time to be stabilized as shown in FIG. 7 although this charging time is proportional to the size of the resistor 613, and varies depending on how large the resistor 613 is.

Thus, the charging time from time t0 at which the input signal IN rises to time t1 at which the voltage VGATE reaches a steady-state value is long, and the switching operation is accordingly slow.

Meanwhile, when the input signal IN falls at time t2, the gate-source capacity of the PMOS transistor 612 is discharged through the resistor 611. As shown in FIG. 7, the voltage VGATE increases to be stabilized at the voltage VDD finally. The voltage VGATE takes a long time to be stabilized as shown in FIG. 7 although this discharging time is proportional to the resistance value of the resistor 611, and varies depending on how large the resistance value of the resistor 611 is.

Thus, the discharging time from time t2 at which the input signal IN falls to time t3 at which the voltage VGATE reaches the steady-state value is long, and the switching operation is accordingly slow.

SUMMARY OF THE INVENTION

The present invention has been made in order to solve the problem described above, and provides an output circuit capable of achieving high-speed switching operation.

According to one embodiment of the present invention, there is provided an output circuit, including: a first power supply terminal; a second power supply terminal; an output terminal; a control voltage generating circuit, which is connected between the first power supply terminal and the second power supply terminal, and is configured to generate a control voltage; a first MOS transistor of a first conductivity type, having a gate to which the control voltage is input, and a source having a voltage that is clamped to be larger than a first predetermined voltage; a second MOS transistor of the first conductivity type, having a gate to which a first input signal is input, a source connected to the first power supply terminal, and a drain connected to the source of the first MOS transistor; a third MOS transistor of a second conductivity type, having a gate to which a second input signal is input, a source connected to the second power supply terminal, and a drain connected to the drain of the first MOS transistor; and a fourth MOS transistor of the first conductivity type, which has a source connected to the first power supply terminal, a gate connected to the source of the first MOS transistor, and a drain connected to the output terminal, and is configured to be driven with the first input signal and the second input signal to output an output signal to the output terminal, the control voltage generating circuit being configured to absorb fluctuations in the control voltage, which are caused due to changes in the first input signal and the second input signal, to thereby maintain the control voltage at a second predetermined voltage.

According to the output circuit of the present invention, a gate voltage of the fourth MOS transistor is clamped by the first MOS transistor, and further the control voltage generating circuit is configured to absorb fluctuations in control voltage that is input to the gate of the first MOS transistor, with the result that a gate voltage of the first MOS transistor is maintained at a stable voltage. In addition, the second and third MOS transistors are configured to drive the gate of the fourth MOS transistor, and hence a gate-source capacity of the fourth MOS transistor can be charged and discharged through a path having no resistor. As a result, stable and high-speed switching operation can be achieved.

DETAILED DESCRIPTION OF THE PREFERRED EMBODIMENTS

Now, an embodiment of the present invention is described with reference to the drawings.

Figure 1:
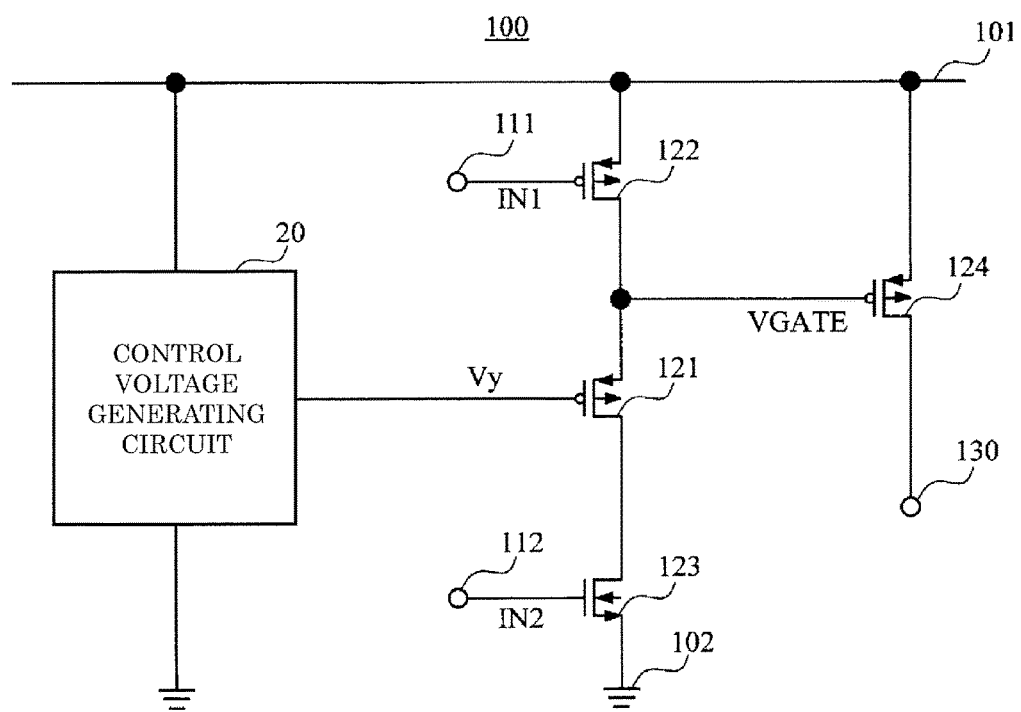
FIG. 1 is a circuit diagram for illustrating an output circuit according to an embodiment of the present invention.

FIG. 1 is a circuit diagram of an output circuit 100 according to the embodiment of the present invention.

The output circuit 100 of this embodiment includes a power supply terminal (also referred to as "first power supply terminal") 101, a ground terminal 102 (also referred to as "second power supply terminal"), a first input terminal 111, a second input terminal 112, PMOS transistors 121, 122, and 124, an NMOS transistor 123, an output terminal 130, and a control voltage generating circuit 20.

The PMOS transistor 124 has a source connected to the power supply terminal 101, and a drain connected to the output terminal 130. The PMOS transistor 122 has a source connected to the power supply terminal 101, and a gate connected to the first input terminal 111. The PMOS transistor 121 has a source connected to a drain of the PMOS transistor 122 and a gate of the PMOS transistor 124. The NMOS transistor 123 has a source connected to the ground terminal 102, a gate connected to the second input terminal 112, and a drain connected to a drain of the PMOS transistor 121.

The control voltage generating circuit 20 is connected between the power supply terminal 101 and the ground terminal 102, and is configured to supply an output voltage to the gate of the PMOS transistor 121 as a control voltage Vy.

First, the outline of operation of the output circuit 100 having the above-mentioned configuration is described below.

When each of a first input signal IN1 and a second input signal IN2 changes from a low level to a high level, in other words, when the PMOS transistor 122 changes from an ON state to an OFF state and the NMOS transistor 123 changes from the OFF state to the ON state, the NMOS transistor 123 charges a gate-source capacity of the PMOS transistor 124 through the PMOS transistor 121, and hence a voltage VGATE decreases. Fluctuations due to this decrease are transferred to an output of the control voltage generating circuit 20 through a gate-source capacity of the PMOS transistor 121. That is, the control voltage Vy is to, fluctuate in a decreasing direction. At this time, the control voltage generating circuit 20 operates to absorb the fluctuations such that the control voltage Vy increases and returns to a predetermined voltage.

Further, when each of the first input signal IN1 and the second input signal IN2 changes from the high level to the low level, in other words, when the PMOS transistor 122 changes from the OFF state to the ON state and the NMOS transistor 123 changes from the ON state to the OFF state, the PMOS transistor 122 discharges the gate-source capacity of the PMOS transistor 124, and hence the voltage VGATE increases. Fluctuations due to this increase are transferred to the output of the control voltage generating circuit 20 through the gate-source capacity of the PMOS transistor 121. That is, the control voltage Vy is to fluctuate in an increasing direction. At this time, the control voltage generating circuit 20 operates to absorb the fluctuations such that the control voltage Vy decreases and returns to the predetermined voltage.

As described above, the control voltage generating circuit 20 functions to absorb fluctuations in the control voltage Vy, which are caused due to changes in the first input signal IN1 and the second input signal IN2, thereby maintaining the control voltage Vy at the predetermined voltage.

Figure 2:
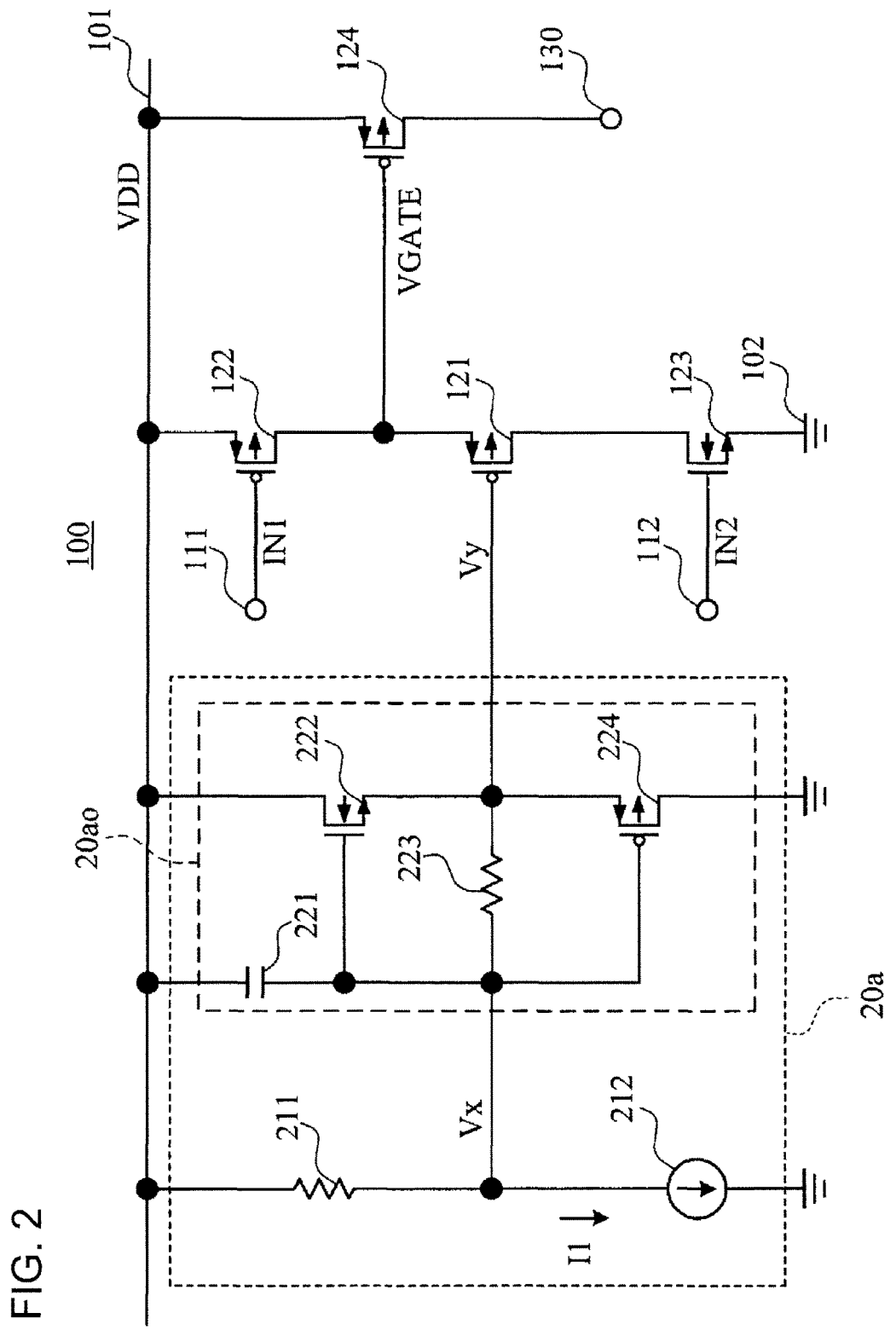
FIG. 2 is a circuit diagram for illustrating the output circuit according to the embodiment of the present invention, and is a diagram for illustrating a first example of a control voltage generating circuit of FIG. 1.
Figure 4:
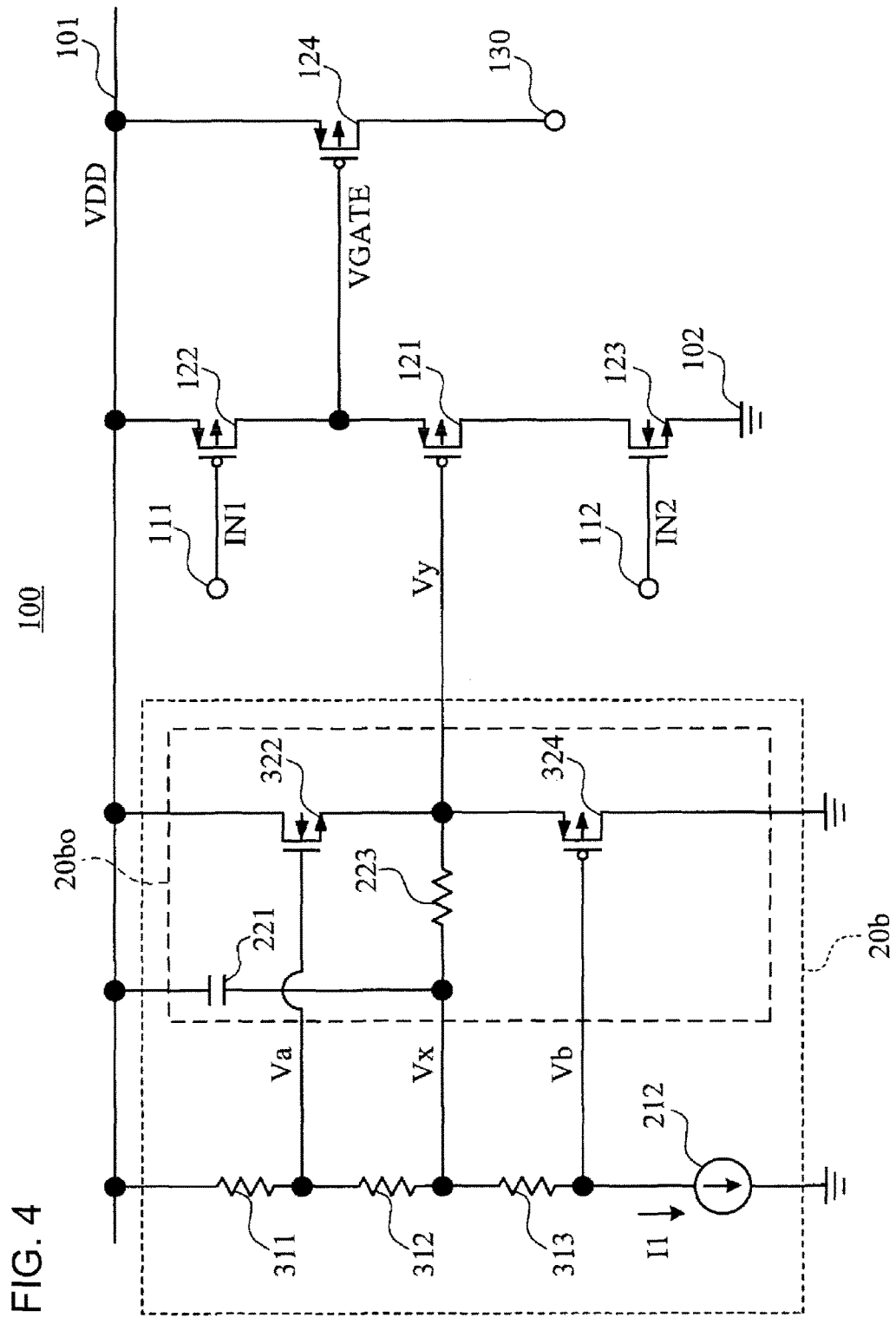
FIG. 4 is a circuit diagram for illustrating the output circuit according to the embodiment of the present invention, and is a diagram for illustrating a second example of the control voltage generating circuit of FIG. 1.
Figure 5:
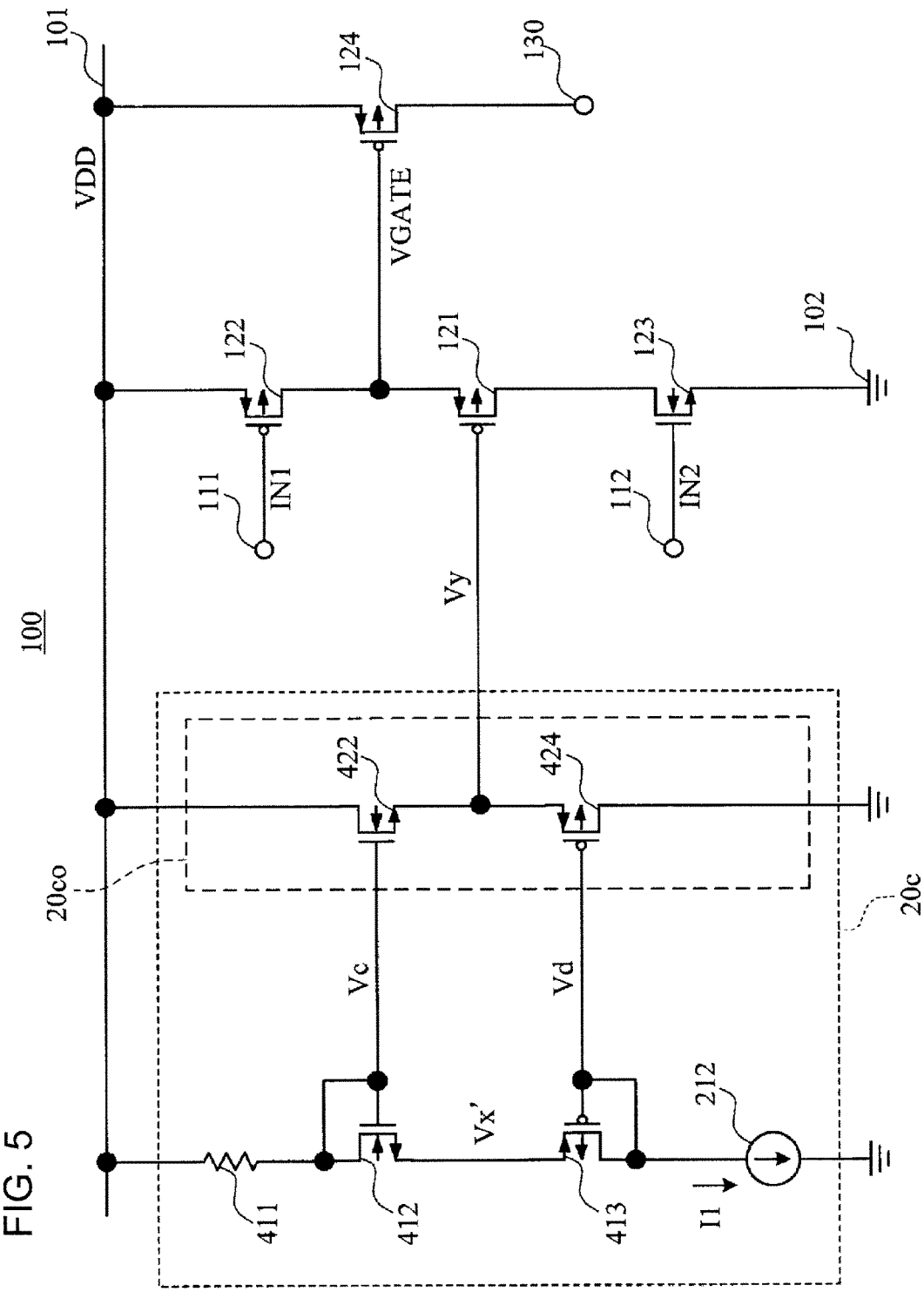
FIG. 5 is a circuit diagram for illustrating the output circuit according to the embodiment of the present invention, and is a diagram for illustrating a third example of the control voltage generating circuit of FIG. 1.
Figure 6:
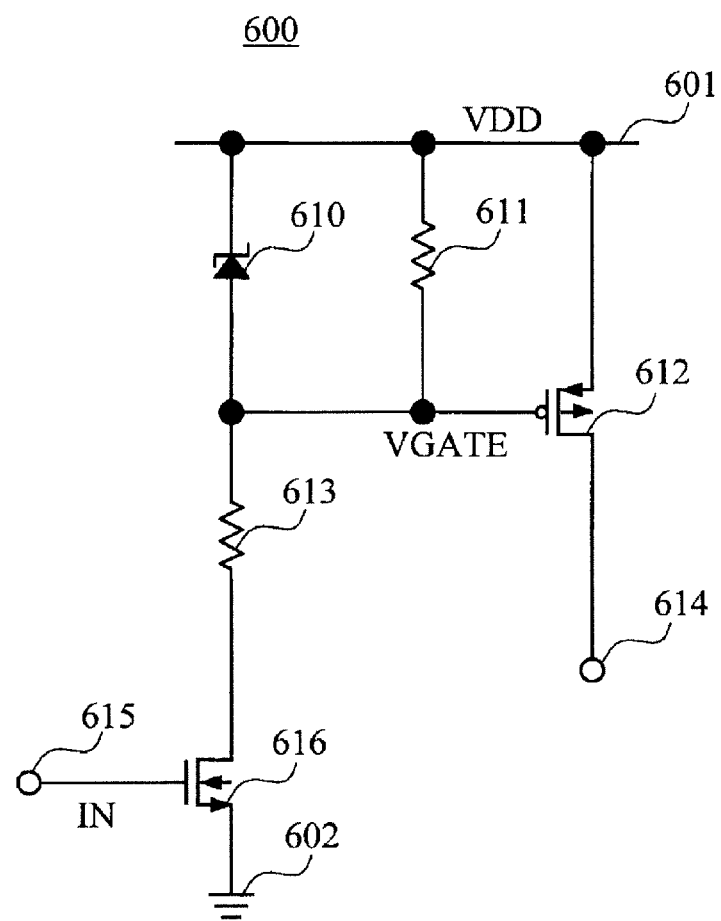
FIG. 6 is a circuit diagram of a related-art output circuit.

Now, examples of the specific circuit configuration of the control voltage generating circuit 20 and the operation thereof in the output circuit 100 of this embodiment are described with reference to FIG. 2 to FIG. 5. FIG. 2 is a diagram of a control voltage generating circuit 20a corresponding to a first example of the control voltage generating circuit 20, FIG. 4 is a diagram of a control voltage generating circuit 20b corresponding to a second example thereof, and FIG. 5 is a diagram of a control voltage generating circuit 20c corresponding to a third example thereof.

First, the output circuit 100 including the control voltage generating circuit 20a, which is the first example of the control voltage generating circuit 20, is described.

In the output circuit 100 of FIG. 2, other parts than the control voltage generating circuit 20a are the same as those of the output circuit 100 illustrated in FIG. 1, and description thereof is thus omitted.

As illustrated in FIG. 2, the control voltage generating circuit 20a, which is the first example, includes a resistor 211, a constant current source 212, a capacitor 221, an NMOS transistor 222, a resistor 223, and a PMOS transistor 224.

The resistor 211 and the constant current source 212 are connected in series between the power supply terminal 101 and the ground terminal 102, and the NMOS transistor 222 and the PMOS transistor 224 are also connected in series between the power supply terminal 101 and the ground terminal 102.

The capacitor 221 has one end connected to the power supply terminal 101, and the other end connected to a gate of the NMOS transistor 222. The resistor 223 has one end connected to a node between the resistor 211 and the constant current source 212, the gate of the NMOS transistor 222, and a gate of the PMOS transistor 224, and the other end connected to a node between the NMOS transistor 222 and the PMOS transistor 224.

Here, the capacitor 221, the NMOS transistor 222, the resistor 223, and the PMOS transistor 224 form an output stage 20ao of the control voltage generating circuit 20a. The output stage 20ao is configured to receive a voltage Vx at the node between the resistor 211 and the constant current source 212 to output the control voltage Vy from the node between the NMOS transistor 222 and the PMOS transistor 224.

Next, the operation of the output circuit 100 including the control voltage generating circuit 20a as described above is described.

For the purpose of description, here, a resistance value of the resistor 211 is represented by R1, a current value of the constant current source 212 is represented by I1, and a voltage at the power supply terminal 101 is represented by VDD.

As a first state, there is assumed a case in which a voltage VDD-5 V is input to the input terminal 111 as the first input signal IN1, and a voltage of 0 V is input to the input terminal 112 as the second input signal IN2, and the operation of the output circuit 100 in this case is described.

In this case, the PMOS transistor 122 is turned on, and the NMOS transistor 123 is turned off. Thus, the gate voltage VGATE of the PMOS transistor 124 is equal to the power supply voltage VDD, and the PMOS transistor 124 is turned off. Further, the resistor 211 and the constant current source 212 are connected in series, and the voltage Vx at the node therebetween is expressed by the following expression (1).

$$Vx = VDD - I1 \times R1 \quad (1)$$

The output stage 20ao of the control voltage generating circuit 20a has high input impedance and low output impedance, and operates such that input voltage and output voltage are equal to each other. Thus, the output voltage (control voltage) Vy and the voltage Vx are equal to each other.

As a second state, there is assumed a case in which a voltage VDD is input to the input terminal 111 as the first input signal IN1, and a voltage of 5 V is input to the input terminal 112 as the second input signal IN2, and the operation of the output circuit 100 in this case is described.

In this case, the PMOS transistor 122 is turned off, and the NMOS transistor 123 is turned on. Further, the voltage Vx and the voltage Vy are equal to those in the above-mentioned first state. In this state, current flows through a series path of the gate-source capacity of the PMOS transistor 124, the PMOS transistor 121, and the NMOS transistor 123, and the gate voltage VGATE of the PMOS transistor 124 is clamped by the PMOS transistor 121, which is expressed by the following expression (2).

$$VGATE = VDD - I1 \times R1 + |VTHP| \quad (2)$$

In the expression (2), |VTHP| indicates an absolute value of a threshold voltage of the PMOS transistor 121. When VDD=20 V, I1*R1=6 V, and |VTHP|=1 V, the voltage VGATE is 15 V. The absolute value of the gate-source voltage of the PMOS transistor 124 is restricted to 5 V.

As a third state, the operation of the output circuit 100 in a region of the transition from the first state to the second state is described.

When voltages at the input terminal 111 and the input terminal 112 transition from the first state to the second state, the PMOS transistor 122 is turned off, and the NMOS transistor 123 is turned on. The NMOS transistor 123 charges the gate-source capacity of the PMOS transistor 124 through the PMOS transistor 121, and hence the voltage VGATE decreases.

Fluctuations due to this decrease are transferred to the output of the control voltage generating circuit 20a through the gate-source capacity of the PMOS transistor 121. Further, in order to achieve high-speed switching operation, it is necessary to increase the width of the gate of the PMOS transistor 121, which is a clamping element, to reduce the on resistance thereof. In this case, however, the gate-source capacity of the PMOS transistor 121 increases accordingly, and larger fluctuations are transferred to the output of the control voltage generating circuit 20a.

However, the fluctuations are transferred through a path of the resistor 223 and the capacitor 221 forming a low-pass filter, in the output stage 20ao in the control voltage generating circuit 20a, and hence the voltage Vx does not change. Meanwhile, the voltage Vy changes due to the fluctuations, but when the voltage Vy decreases and a gate-source voltage of the NMOS transistor 222 exceeds the threshold of the NMOS transistor 222, the NMOS transistor 222 is turned on to prevent the voltage Vy from decreasing. In this case, the voltage Vx and the voltage Vy has a potential difference that corresponds to the threshold of the NMOS transistor 222, but the potentials of the voltages may be regarded to have equivalent values.

As described above, the output stage 20ao in the control voltage generating circuit 20a has a role of absorbing the fluctuations, and is necessary to achieve high-speed switching operation. If the output stage 20ao is eliminated and the voltage Vx is directly applied to the gate of the PMOS transistor 121, the voltage Vx greatly fluctuates and the PMOS transistor 121 does not perform the clamping operation stably, with the result that a voltage exceeding a gate-source withstand voltage of the PMOS transistor 124 may be generated.

As a fourth state, the operation of the output circuit 100 in a region of the transition from the second state to the first state is described. When voltages at the input terminal 111 and the input terminal 112 transition from the second state to the first state, the PMOS transistor 122 is turned on, and the NMOS transistor 123 is turned off. The PMOS transistor 122 discharges the gate-source capacity of the PMOS transistor 124, and hence the voltage VGATE increases. In the same manner as the third state, fluctuations due to this increase are transferred to the output of the control voltage generating circuit 20a through the gate-source capacity of the PMOS transistor 121. The voltage Vy changes due to the fluctuations, but when the voltage Vy increases and a gate-source voltage of the PMOS transistor 224 exceeds the threshold of the PMOS transistor 224, the PMOS transistor 224 is turned on to prevent the voltage Vy from increasing.

As described above, the output stage 20ao in the control voltage generating circuit 20a absorbs fluctuations in voltage Vy, with the result that high-speed switching operation is achieved.

In the manner as described above, the output circuit 100 including the control voltage generating circuit 20a can drive the PMOS transistor 124 at high speed based on the signals IN1 and IN2 input to the input terminals 111 and 112.

Figure 3:
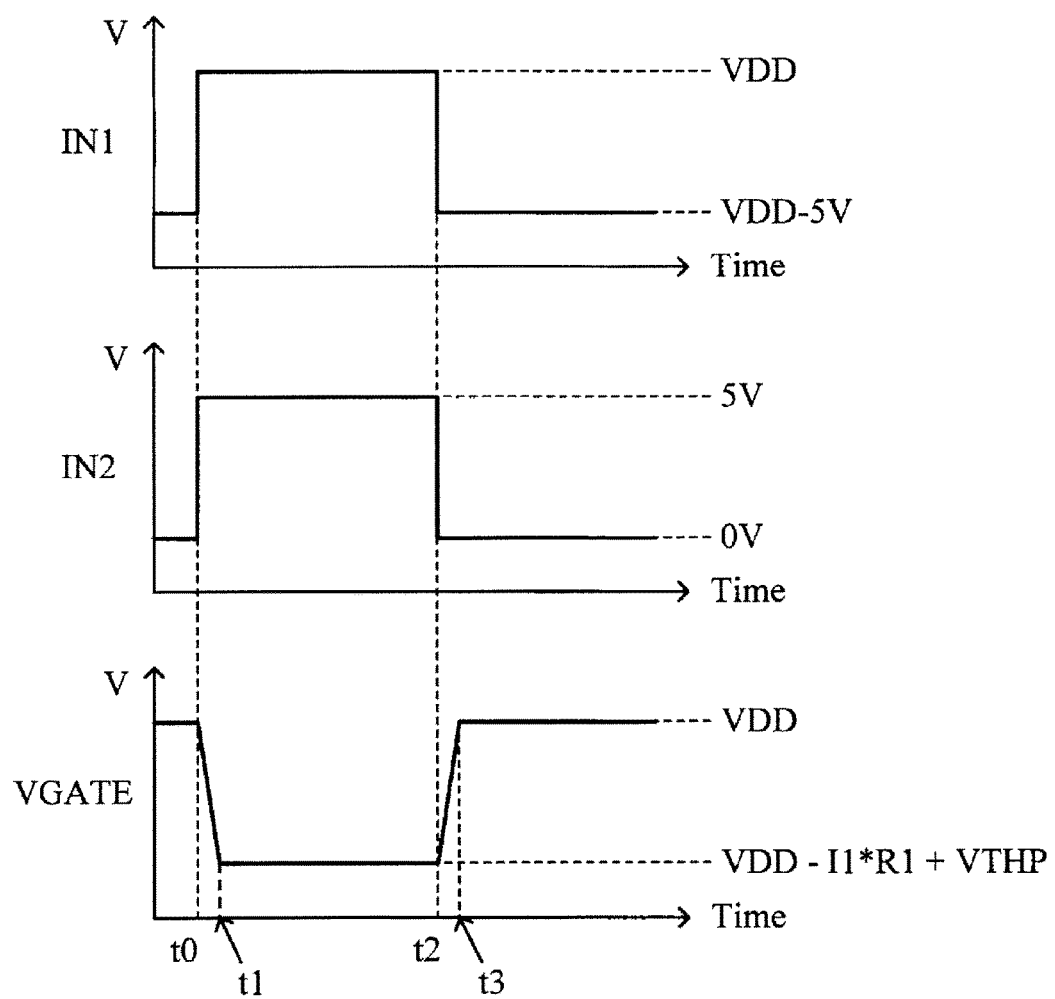
FIG. 3 is a graph for showing the wavelength at each node of the output circuit of FIG. 2.

FIG. 3 is a graph for showing the wavelengths of the signal IN1 input to the input terminal 111, the signal IN2 input to the input terminal 112, and the voltage VGATE of the output circuit 100 of this embodiment illustrated in FIG. 2. Here, the maximum value of the signal IN1 is represented by VDD, the minimum value thereof is represented by VDD-5 V, the maximum value of the signal IN2 is 5 V, and the minimum value thereof is 0 V.

Figure 7:
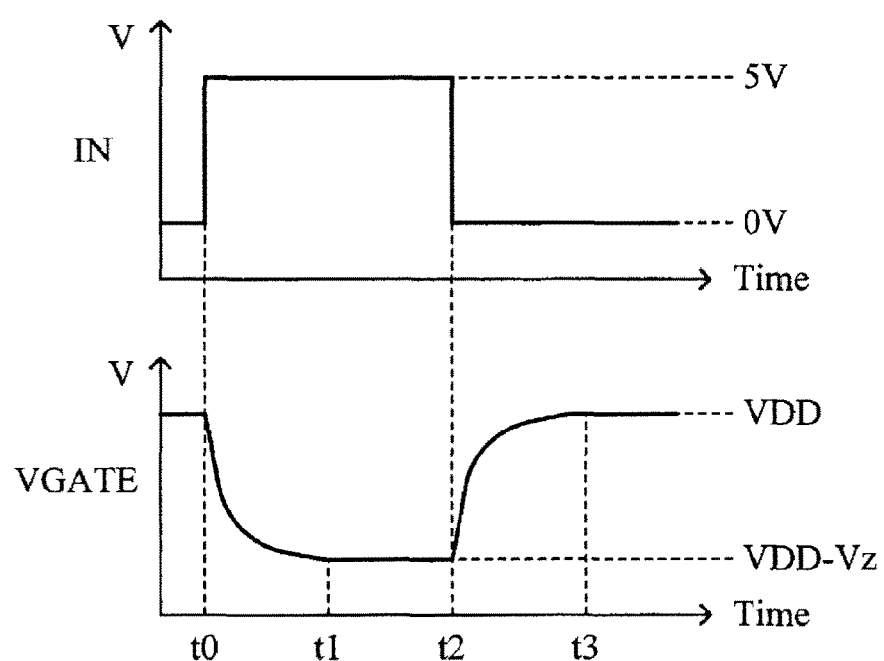
FIG. 7 is a graph for showing the wavelengths of an input signal IN and a gate voltage of a PMOS transistor of the output circuit of FIG. 6.

When the signals IN1 and IN2 rise at time t0, the output circuit 100 operates as described above, and hence the slope of the wavelength of the voltage VGATE from time t0 to time t1 by which the voltage VGATE reaches the steady-state value, which is described in the description of the first state, is sharper than that of the wavelength of the voltage VGATE of a related-art output circuit 600 illustrated in FIG. 7. Further, when the signals IN1 and IN2 fall at time t2, in the same manner as the above, the slope of the wavelength of the voltage VGATE from time t2 to time t3 by which the voltage VGATE reaches the steady-state value, which is described in the description of the second state, is sharper than that of the wavelength of the voltage VGATE of the related-art output circuit 600 illustrated in FIG. 7. This means that the output circuit 100 of this embodiment can perform switching operation at a higher speed than the related-art output circuit 600.

As describe above, according to the configuration of this embodiment, the gate-source capacity of the PMOS transistor 124 is charged and discharged through the path having no resistor, and the output stage 20ao whose output impedance is reduced absorbs fluctuations in control voltage Vy. In this way, high-speed switching operation can be achieved.

Next, the output circuit 100 including the control voltage generating circuit 20b, which is the second example of the control voltage generating circuit 20, is described.

In the output circuit 100 of FIG. 4, other parts than the control voltage generating circuit 20b are the same as those of the output circuit 100 illustrated in FIG. 1, and description thereof is thus omitted. In addition, the same components as those of the control voltage generating circuit 20a illustrated in FIG. 2, which is the first example of the control voltage generating circuit 20, are denoted by the same reference symbols, and redundant description is omitted as appropriate.

As illustrated in FIG. 4, the control voltage generating circuit 20b, which is the second example, includes resistors 311, 312, and 313, the constant current source 212, the capacitor 221, an NMOS transistor 322, the resistor 223, and a PMOS transistor 324.

The control voltage generating circuit 20b is different from the control voltage generating circuit 20a illustrated in FIG. 2 in the following points.

The resistors 311, 312, and 313 are connected in series between the power supply terminal 101 and the constant current source 212, instead of the resistor 211 of the control voltage generating circuit 20a. Further, a node between the resistors 312 and 313 is connected to the one end of the resistor 223, a node between the resistors 311 and 312 is connected to a gate of the NMOS transistor 322, and a node between the resistor 313 and the constant current source 212 is connected to a gate of the PMOS transistor 324.

Here, the capacitor 221, the NMOS transistor 322, the resistor 223, and the PMOS transistor 324 form an output stage 20bo of the control voltage generating circuit 20b.

The operation of the output circuit 100 including the control voltage generating circuit 20b is described. The different points from the output circuit 100 including the control voltage generating circuit 20a illustrated in FIG. 2 are especially described.

The control voltage generating circuit 20b is configured to supply a current I1 from the constant current source 212 to the resistors 311, 312, and 313 connected in series, to thereby generate a voltage Va, the voltage Vx, and a voltage Vb at the node between the resistors 311 and 312, the node between the resistors 312 and 313, and the node between the resistor 313 and the constant current source 212, respectively.

When the control voltage generating circuit 20b is designed such that the sum of the resistance values of the resistors 311 and 312 is R1, the voltage Vx takes a value equal to that in the above-mentioned expression (1). The voltage Va is supplied to the gate of the NMOS transistor 322.

Here, as an example, the voltage Va is selected such that a potential difference between the voltage Va and the voltage Vx does not exceed the threshold of the NMOS transistor 322, and the voltage Vb is selected such that a potential difference between the voltage Vb and the voltage Vx does not exceed the threshold of the PMOS transistor 324.

The output circuit 100 of this example operates in the first state and the second state in the same manner as the output circuit 100 including the control voltage generating circuit 20a illustrated in FIG. 2, and hence the third state and the fourth state are described, in which the output circuit 100 of this example operates differently from the output circuit 100 of FIG. 2.

The operation in the third state is described. Fluctuations due to the decrease in voltage VGATE are transferred to the output of the control voltage generating circuit 20b through the gate-source capacity of the PMOS transistor 121, as described above. When the fluctuations due to the decrease are transferred through the path of the resistor 223 and the capacitor 221, the voltage Vy changes but the voltages Vx, Va, and Vb do not change because the resistor 223 and the capacitor 221 form the low-pass filter. When the voltage Vy decreases and a potential difference between the voltage Va and the voltage Vy exceeds the threshold of the NMOS transistor 322, the NMOS transistor 322 is turned on to prevent the voltage Vy from decreasing. In the control voltage generating circuit 20b of this example, the potential difference between the voltage Va and the voltage Vx is applied in advance between the gate and a source of the NMOS transistor 322. Thus, the NMOS transistor 322 can be turned on under a state in which the amount of decrease in voltage Vy is small. As a result, the output stage 20bo of the control voltage generating circuit 20b has a higher effect of preventing the output voltage Vy from fluctuating in the decreasing direction than the output stage 20ao of the control voltage generating circuit 20a.

The operation in the fourth state is described. Fluctuations due to the increase in voltage VGATE are transferred to the output of the control voltage generating circuit 20b through the gate-source capacity of the PMOS transistor 121, as described above. When the fluctuations due to the increase are transferred through the path of the resistor 223 and the capacitor 221, the voltage Vy changes but the voltages Vx, Va, and Vb do not change because the resistor 223 and the capacitor 221 form the low-pass filter. When the voltage Vy increases and a potential difference between the voltage Vb and the voltage Vy exceeds the threshold of the PMOS transistor 324, the PMOS transistor 324 is turned on to prevent the voltage Vy from increasing. In the control voltage generating circuit 20b of this example, the potential difference between the voltage Vb and the voltage Vx is applied in advance between the gate and a source of the PMOS transistor 324. Thus, the PMOS transistor 324 can be turned on under a state in which the amount of increase in voltage Vy is small. As a result, the output stage 20bo of the control voltage generating circuit 20b has a higher effect of preventing the output voltage Vy from fluctuating in the increasing direction than the output stage 20ao of the control voltage generating circuit 20a.

As described above, in the control voltage generating circuit 20b, it is possible to prevent the voltage Vy from fluctuating because output of the output stage 20bo has low impedance. Thus, similarly to the case using the control voltage generating circuit 20a, which is the first example, the output circuit 100 can achieve high-speed switching operation.

Next, the output circuit 100 including the control voltage generating circuit 20c, which is the third example of the control voltage generating circuit 20, is described.

In the output circuit 100 of FIG. 5, other parts than the control voltage generating circuit 20c are the same as those of the output circuit 100 illustrated in FIG. 1, and description thereof is thus omitted. In addition, the same components as those of the control voltage generating circuit 20a illustrated in FIG. 2, which is the first example of the control voltage generating circuit 20, are denoted by the same reference symbols, and redundant description is omitted as appropriate.

As illustrated in FIG. 5, the control voltage generating circuit 20c, which is the third example, includes a resistor 411, an NMOS transistor 412, a PMOS transistor 413, the constant current source 212, an NMOS transistor 422, and a PMOS transistor 424.

The control voltage generating circuit 20c is different from the control voltage generating circuit 20a illustrated in FIG. 2 in the following points.

The resistor 411, the NMOS transistor 412 including a drain and a gate that are connected in common, and the PMOS transistor 413 including a drain and a gate that are connected in common are connected in series between the power supply terminal 101 and the constant current source 212 instead of the resistor 211 of the control voltage generating circuit 20a. Further, the gate of the NMOS transistor 412 is connected to a gate of the NMOS transistor 422, and the gate of the PMOS transistor 413 is connected to a gate of the PMOS transistor 424.

Here, the NMOS transistor 422 and the PMOS transistor 424 form an output stage 20co of the control voltage generating circuit 20c.

The operation of the output circuit 100 including the control voltage generating circuit 20c is described. The different points from the output circuit 100 including the control voltage generating circuit 20a illustrated in FIG. 2 are especially described.

The control voltage generating circuit 20c is configured to supply the current I1 from the constant current source 212 to the resistor 411, the NMOS transistor 412, and the PMOS transistor 413 connected in series, to thereby generate a voltage Vc and a voltage Vd at the gate of the NMOS transistor 422, and the gate of the PMOS transistor 424, respectively. Further, the output voltage (control voltage) Vy is output from a node between the NMOS transistor 422 and the PMOS transistor 424.

The voltage Vc is expressed by an expression (3) where the resistance value of the resistor 411 is represented by R2, and the voltage Vc is supplied to the gate of the NMOS transistor 422.

$$Vc = VDD - I1 \times R2 \tag{3}$$

The voltage Vd is expressed by an expression (4), and the voltage Vd is supplied to the gate of the PMOS transistor 424.

$$Vd = VDD - I1 \times R2 - VGSN - |VGSP| \tag{4}$$

In the expression (4), |VGSN| indicates the absolute value of the gate-source voltage of the NMOS transistor 412, and |VGSP| indicates the absolute value of the gate-source voltage of the PMOS transistor 413.

A voltage Vx' at a node between the NMOS transistor 412 and the PMOS transistor 413 is expressed by an expression (5).

$$Vx' = VDD - I1 \times R2 - VGSN \tag{5}$$

For the purpose of simplifying description, the resistance value R2 of the resistor 411 is adjusted such that the voltage Vx' is equal to the voltage Vx in the description of the output circuit 100 including the control voltage generating circuit 20a. When the NMOS transistors 412 and 422 have the same size, and the PMOS transistors 413 and 424 have the same size, each pair is biased by the same gate-source voltage and the same current flows therethrough. Further, the voltage Vx' is equal to the voltage Vy.

The output circuit 100 of this example operates in the first state and the second state in the same manner as the output circuit 100 including the control voltage generating circuit 20a illustrated in FIG. 2, and hence the third state and the fourth state are described, in which the output circuit 100 of this example operates differently from the output circuit 100 of FIG. 2.

The operation in the third state is described. Fluctuations due to the decrease in voltage VGATE are transferred to the output of the control voltage generating circuit 20c through the gate-source capacity of the PMOS transistor 121, as described above. When the voltage Vy decreases, the absolute value of the gate-source voltage of the NMOS transistor 422 further increases to increase a drain current of the NMOS transistor 422, thereby preventing the voltage Vy from decreasing. In the output circuit 100 including the control voltage generating circuit 20c of this example, a potential difference between the voltage Vc and the voltage Vx' is applied in advance to the gate-source voltage of the NMOS transistor 422. Thus, the drain current of the NMOS transistor 422 can be increased under the state in which the amount of decrease in voltage Vy is small. In other words, the control voltage generating circuit 20c has a higher effect of preventing the output voltage Vy from fluctuating in the decreasing direction.

The operation in the fourth state is described. Fluctuations due to the increase in voltage VGATE are transferred to the output of the control voltage generating circuit 20c through the gate-source capacity of the PMOS transistor 121, as described above. When the voltage Vy increases, the absolute value of the gate-source voltage of the PMOS transistor 424 further increases to increase a drain current of the PMOS transistor 424, thereby preventing the voltage Vy from increasing. In the output circuit 100 including the control voltage generating circuit 20c of this example, a potential difference between the voltage Vd and the voltage Vx' is applied in advance to the gate-source voltage of the PMOS transistor 424. Thus, the drain current of the PMOS transistor 424 can be increased under the state in which the amount of increase in voltage Vy is small. In other words, the control voltage generating circuit 20c has a higher effect of preventing the output voltage Vy from fluctuating in the increasing direction.

As described above, also in the control voltage generating circuit 20c of this example, it is possible to prevent the voltage Vy from fluctuating because output of the output stage 20co has low impedance. Thus, similarly to the case using the control voltage generating circuit 20a, which is the first example, the output circuit 100 can achieve high-speed switching operation.

The embodiment of the present invention has been described above, but the present invention is not limited to the above-mentioned embodiment, and it is understood that various modifications can be made thereto without departing from the gist of the present invention.

For example, in the examples of the above-mentioned embodiment, the MOS transistor is used as the transistor connected to the output terminal 130, but a bipolar transistor or other components may be used instead. Further, in the circuit configuration of the above-mentioned embodiment, the polarities of the PMOS transistor and the NMOS transistor may be reversed.

Further, in the above-mentioned embodiment, the resistor, the NMOS transistor, and the PMOS transistor are used to generate the voltage Vx (Vx'). However, a diode or a Zener diode may be used instead, and any configuration capable of generating a predetermined constant voltage may be employed.

What is claimed is:

1. An output circuit, comprising:
    a first power supply terminal;
    a second power supply terminal;
    an output terminal;
    a control voltage generating circuit connected between the first power supply terminal and the second power supply terminal, and configured to generate a control voltage at an output thereof;
    a first MOS transistor of a first conductivity type, including a gate connected to the output of the control voltage generating circuit and receiving the control voltage as an input, and a source having a voltage that is clamped to be larger than a first predetermined voltage;
    a second MOS transistor of the first conductivity type, including a gate to which a first input signal is input, a source connected to the first power supply terminal, and a drain connected to the source of the first MOS transistor;
    a third MOS transistor of a second conductivity type, including a gate to which a second input signal is input, a source connected to the second power supply terminal, and a drain connected to the drain of the first MOS transistor; and
    a fourth MOS transistor of the first conductivity type, including a source connected to the first power supply terminal, a gate connected to the source of the first MOS transistor, and a drain connected to the output terminal, and configured to be driven with the first input signal and the second input signal and to output an output signal to the output terminal,
    wherein a gate voltage of the fourth MOS transistor is clamped by the first MOS transistor, and the control voltage generating circuit is configured to absorb fluctuations in the control voltage, caused by changes in the first input signal and the second input signal, and to thereby maintain the control voltage at a second predetermined voltage.

2. An output circuit according to claim 1, wherein the control voltage generating circuit comprises:
    a constant current source including a first end connected to the second power supply terminal;
    a first resistor including a first end connected to the first power supply terminal, and a second end connected to a second end of the constant current source;
    a second resistor including a first end connected to the first end of the first resistor, and a second end connected to the gate of the first MOS transistor;
    a capacitor including a first end connected to the first power supply terminal, and a second end connected to the first end of the second resistor;
    a fifth MOS transistor of the second conductivity type, including a gate connected to the second end of the first resistor, a drain connected to the first power supply terminal, and a source connected to the gate of the first MOS transistor; and
    a sixth MOS transistor of the first conductivity type, including a gate connected to the second end of the first resistor, a drain connected to the second power supply terminal, and a source connected to the gate of the first MOS transistor.

3. An output circuit according to claim 1, wherein the control voltage generating circuit comprises:
    a constant current source including one end connected to the second power supply terminal;
    a first resistor, a second resistor, and a third resistor connected in series between the first power supply terminal and another end of the constant current source in the stated order;
    a fourth resistor including one end connected to a node between the second resistor and the third resistor, and another end connected to the gate of the first MOS transistor;
    a capacitor including one end connected to the first power supply terminal, and another end connected to the node between the second resistor and the third resistor;
    a fifth MOS transistor of the second conductivity type, including a gate connected to a node between the first resistor and the second resistor, a drain connected to the first power supply terminal, and a source connected to the gate of the first MOS transistor; and
    a sixth MOS transistor of the first conductivity type, including a gate connected to a node between the third resistor and the constant current source, a drain connected to the second power supply terminal, and a source connected to the gate of the first MOS transistor.

4. An output circuit according to claim 1, wherein the control voltage generating circuit comprises:
    a constant current source including one end connected to the second power supply terminal;
    a fifth MOS transistor of the first conductivity type, including a drain and a gate that are connected in common and are connected to another end of the constant current source;
    a sixth MOS transistor of the second conductivity type, including a drain and a gate connected in common, and a source connected to a source of the fifth MOS transistor;

a first resistor including one end connected to the drain of the sixth MOS transistor, and another end connected to the first power supply terminal;

a seventh MOS transistor of the first conductivity type, including a gate connected to the gate of the fifth MOS transistor, a drain connected to the second power supply terminal, and a source connected to the gate of the first MOS transistor; and an eighth MOS transistor of the second conductivity type, including a gate connected to the gate of the sixth MOS transistor, a drain connected to the first power supply terminal, and a source connected to the gate of the first MOS transistor.

* * * * *